United States Patent
Zhou et al.

(10) Patent No.: US 8,203,389 B1
(45) Date of Patent: Jun. 19, 2012

(54) FIELD TUNABLE SPIN TORQUE OSCILLATOR FOR RF SIGNAL GENERATION

(75) Inventors: Yuchen Zhou, San Jose, CA (US); Kunliang Zhang, Fremont, CA (US); Pokang Wang, Los Altos, CA (US); Joe Smyth, Aptos, CA (US)

(73) Assignee: Headway Technologies, Inc., Milpitas, CA (US)

( * ) Notice: Subject to any disclaimer, the term of this patent is extended or adjusted under 35 U.S.C. 154(b) by 16 days.

(21) Appl. No.: 12/928,194

(22) Filed: Dec. 6, 2010

(51) Int. Cl.
  *H03L 7/26* (2006.01)
(52) U.S. Cl. ........ 331/3; 331/94.1; 365/158; 360/324.1; 360/324.11
(58) Field of Classification Search .............. 331/3, 94.1; 365/158; 360/324.1, 324.11
  See application file for complete search history.

(56) References Cited

U.S. PATENT DOCUMENTS

| | | | |
|---|---|---|---|
| 6,721,141 B1 * | 4/2004 | Attenborough et al. ...... | 360/324 |
| 7,009,877 B1 | 3/2006 | Huai et al. | |
| 7,589,600 B2 | 9/2009 | Dimitrov et al. | |
| 7,616,412 B2 | 11/2009 | Zhu et al. | |
| 7,652,915 B2 | 1/2010 | Folks et al. | |
| 7,764,538 B2 | 7/2010 | Ito | |
| 7,961,439 B2 * | 6/2011 | Sato et al. ...... | 360/324 |
| 2009/0201614 A1 | 8/2009 | Kudo et al. | |
| 2009/0310244 A1 | 12/2009 | Shimazawa et al. | |
| 2010/0110592 A1 | 5/2010 | Koui et al. | |

OTHER PUBLICATIONS

Co-pending US Patent HT09-037, U.S. Appl. No. 12/800,196, filed May 11, 2010, "CoFe/Ni Multilayer Film With Perpendicular Anisotropy for Microwave Assisted Magnetic Recording," assigned to the same assignee as the present invention.

* cited by examiner

*Primary Examiner* — Arnold Kinkead
(74) *Attorney, Agent, or Firm* — Saile Ackerman LLC; Stephen B. Ackerman (57) ABSTRACT

A spin transfer oscillator (STO) device is disclosed with a giant magnetoresistive (GMR) junction comprising a magnetic resistance layer (MRL)/spacer/magnetic oscillation layer (MOL) configuration, and a MR sensor including a sensing layer/junction layer/reference layer configuration. MOL and sensing layer are magnetostatically coupled and separated by a conductive spacer. MRL has perpendicular magnetic anisotropy while MOL and sensing layer have a Mst (saturation magnetization×thickness) value within ±50% of each other. When a magnetic field is applied perpendicular to the planes of the MOL and a high density current flows from the conductive spacer to the MRL, a MOL oscillation state with a certain frequency is induced. Consequently, the sensing layer oscillates with a similar RF frequency and when a low density current flows across the MR sensor, an AC voltage signal is generated to determine the sensing layer frequency that can be varied by adjusting the applied field.

21 Claims, 5 Drawing Sheets

FIG. 8 sistive (TMR) sensors. Anti-ferromagnetic layer 8 pins reference layer 5 and pinned layer 7 through exchange coupling.

FIELD TUNABLE SPIN TORQUE OSCILLATOR FOR RF SIGNAL GENERATION

RELATED PATENT APPLICATION

This application is related to the following: Ser. No. 12/800,196, filing date May 11, 2010; assigned to the same assignee and herein incorporated by reference in its entirety.

FIELD OF THE INVENTION

The invention relates to a perpendicular spin transfer oscillator (PSTO) used for thin film applications such as a RF field generator in spintronic device, and in particular to a PSTO structure having a three electrical terminal structure wherein a high density current is flowed through a GMR junction to induce a magnetic oscillation layer into an oscillation state; and a low density RF signal generation current is flowed though an adjacent TMR junction for sensing an oscillation frequency.

BACKGROUND OF THE INVENTION

Spin transfer (spin torque) devices are based on a spin-transfer effect that arises from the spin dependent electron transport properties of ferromagnetic-spacer-ferromagnetic multilayers. When a spin-polarized current transverses a magnetic multilayer in a CPP (current perpendicular to plane) configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. Spin transfer devices also known as spintronic devices wherein at least one of the ferromagnetic layers in a magnetoresistive (MR) junction has perpendicular magnetic anisotropy have an advantage over devices based solely on in-plane anisotropy in that they can satisfy the thermal stability requirement but also have no limit of cell aspect ratio. As a result, spin valve structures based on PMA are capable of scaling for higher packing density which is a key challenge for future MRAM (Magnetoresistive Random Access Memory) applications and other spintronic devices such as microwave generators.

A spin transfer oscillator (STO) is a magneto-resistive (MR) thin film device which can have an induced RF frequency magnetization oscillation within at least one of its magnetic layers by applying an electrical current. As described in U.S. Pat. No. 7,616,412, an STO may be used as a high Q factor RF signal generator if the oscillating magnetization is transformed into resistance fluctuations through a MR effect. An STO comprises at least three layers including a magnetic oscillating layer (MOL), a magnetic reference layer (MRL), and a non-magnetic spacer sandwiched between the MOL and MRL. These three layers may be considered a junction. When electrons transit the MRL and become polarized, the polarized electrons then pass through the non-magnetic spacer and through the MOL to induce a gyromagnetic oscillation also known as ferromagnetic resonance (FMR) in the MOL. A PSTO (perpendicular spin torque oscillator) is a version of an STO wherein the MRL has perpendicular magnetic anisotropy (PMA) and is magnetized in a direction perpendicular to planes of the junction layers.

With a perpendicular magnetization of the MRL, a full amplitude in-plane oscillation of the MOL can be achieved.

Figure 1:
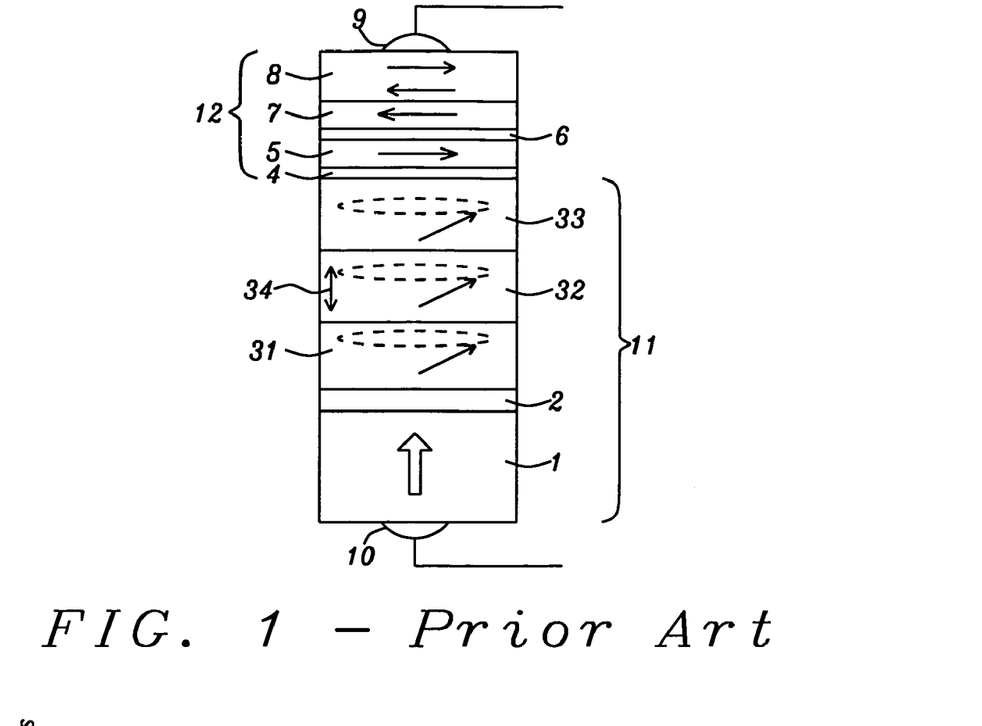
FIG. 1 is a cross-sectional view of a prior art PSTO structure in which magnetization oscillation frequency is sensed by means of an additional stack of layers formed above the PSTO stack.

Referring to FIG. 1, a PSTO structure is depicted from U.S. Pat. No. 7,616,412 and includes MRL 1 that has intrinsic anisotropy which keeps its magnetization perpendicular to the film plane, non-magnetic junction layer 2, and MOL which is a composite comprised of layers 31-33. Layers 31, 33 are soft magnetic layers and middle layer 32 has a perpendicular anisotropy 34 normal to the film plane that biases layers 31, 33 through exchange coupling. Layers 1, 2, and 31-33 constitute the PSTO component 11 of the stack. There are other layers 4-8 above the MOL 3 for sensing the magnetization oscillation of the MOL. In particular, second junction layer 4, reference layer 5 with in-plane magnetization, non-magnetic exchange layer 6 typically made of Ru, and pinned layer 7 are sequentially formed as a second stack 12 on PSTO stack 11. Layers 5-7 comprise a generic synthetic anti-ferromagnetic (SAF) configuration commonly used in commercial giant magnetoresistive (GMR) or tunneling magnetoresistive (TMR) sensors. Anti-ferromagnetic layer 8 pins reference layer 5 and pinned layer 7 through exchange coupling.

During an operating mode, electrons flow through the entire stack from bottom electrical contact 10 to top electrical contact 9, and MRL 1 magnetization is oriented in the opposite direction to that of MOL layers 31-33. As a result of the spin torque effect, electrons passing through the junction layer 2 excite MOL layers 31-33 magnetization from a quiescent near vertical state into an oscillation state. PSTO 11 is intrinsically a MR junction in which relative magnetization angle change between layers 1 and 31-33 will produce a resistance change across stack 11 that can be measured as a voltage signal when a current flows through the stack. However, when MOL layers 31-33 reach a stable magnetic oscillation with a significant amount of in-plane magnetization component, the relative angle between the magnetizations of MRL 1 and MOL 31-33 does not really change which makes it difficult to generate an electrical signal through the resistance change of the MR junction to reflect the MOL oscillation. For RF voltage signal generation purposes, the prior art utilizes SAF and AFM layers above MOL 31-33 where reference layer 5 serves to generate a MR resistance change during MOL magnetization oscillation. Therefore, layers 33, 4, and 5 form another MR junction wherein the relative magnetization angle change between MOL layer 33 and reference layer 5 produces an effective resistance. As current flows between contacts 9 and 10, a voltage signal reflecting MOL layer magnetization oscillation can be produced across the entire stack.

However, there are disadvantages associated with the prior art as pictured in FIG. 1. First of all, since MOL layer 33 is used both as part of the oscillation layer in the lower MR junction and as a signal layer for the top MR junction, there is a continuous current across the two junctions. For efficient STO induced MOL oscillation, layer 2 is preferably metal to result in a lower junction based on a GMR (giant magnetoresistive) effect in which resistivity is generally quite low and current density is relatively high in order to induce MOL oscillation. On the other hand, for high signal output, the top junction involving layer 4 is preferably a TMR (tunneling magnetoresistive) element having a resistivity that is substantially larger than that of the lower GMR junction. As a result of the high current density required to excite MOL oscillation, the top TMR junction will be at a voltage drop exceeding its break down voltage. In other words, a GMR junction and a TMR junction cannot be used in the same device in a configuration where a high density current flows through both structures. This dilemma significantly limits the FIG. 1 structure applicability for actual STO RF signal generation.

Secondly, the spin torque effect from the top MR junction that is comprised of layers 33, 4 and 5 for sensing the MOL 31-33 oscillation interferes with the spin torque effect of the bottom junction of the STO stack 11 so that MOL oscillation quality is degraded by the presence of the SAF layers 5-7 and AFM layer 8. Simulation data is available to support this fact and is presented in FIGS. 2a-2b, and FIGS. 3a-3b.

Figure 2A:
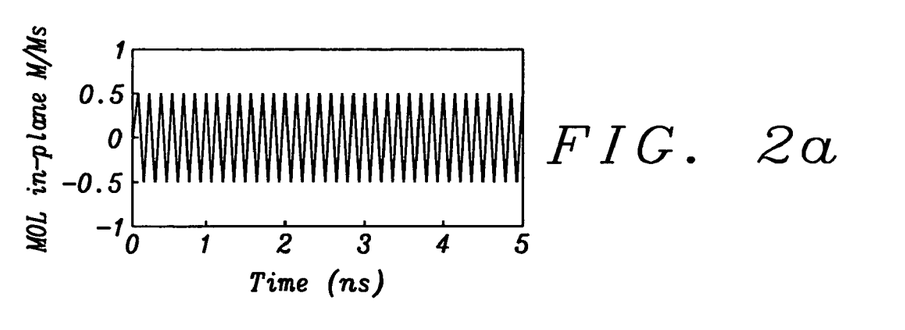
FIG. 2a is a plot showing an oscillation time trace of the in-plane magnetization component of the MOL layer for stack 11 (FIG. 1) only.
Figure 2B:
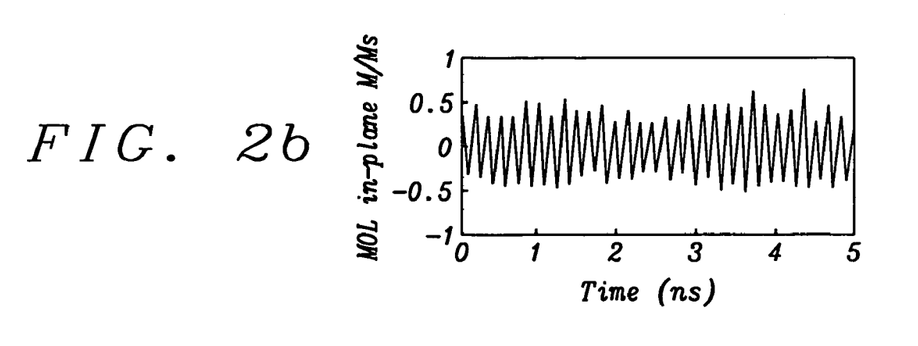
FIG. 2b is a similar oscillation time trace for all layers in FIG. 1 between upper and lower contacts.
Figure 3A:
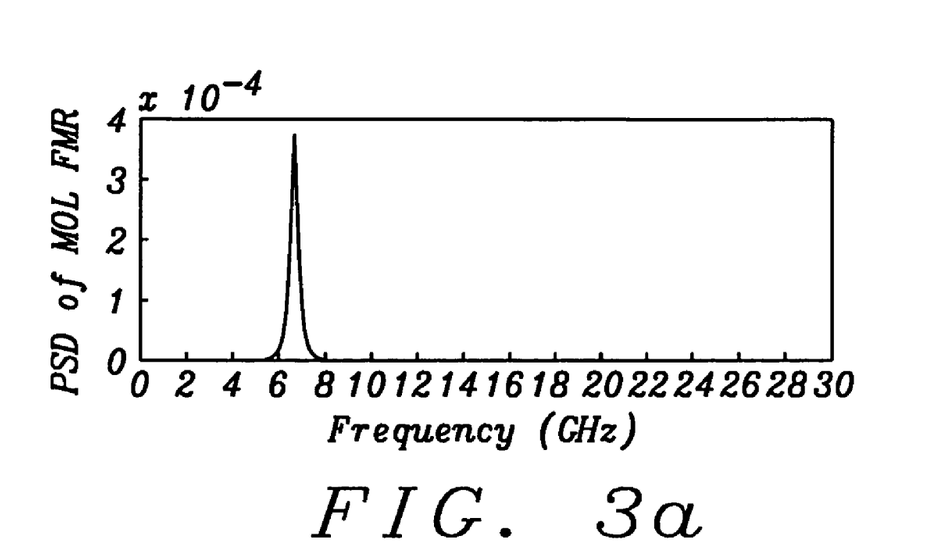
FIG. 3a is the corresponding power-spectrum-density (PSD) of the time traces in FIG. 2a, and FIG. 3b is the corresponding PSD of the time traces in FIG. 2b where the FMR peak represents the frequency and power of the oscillation.
Figure 3B:
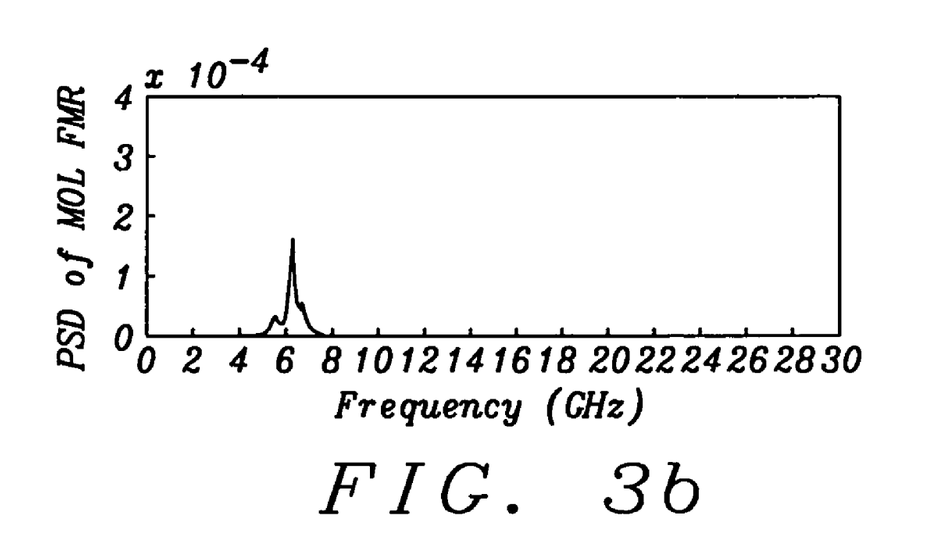

Referring to FIGS. 2a-2b and FIGS. 3a-3b, micro-magnetic simulations are shown for a PSTO comprised of stack 11 only (FIGS. 2a, 3a) and for a PSTO that includes all layers 1-8 in FIG. 1 as depicted in FIGS. 2b, 3b. FIG. 2a is the oscillation time trace of the in-plane magnetization component for MOL in stack 11 only, and FIG. 2b is a similar oscillation time trace for a PSTO having all layers in FIG. 1. FIG. 3a and FIG. 3b are the corresponding power-spectrum-density (PSD) plots of the time traces in FIGS. 2a, 2b, respectively, where the FMR peak represents the frequency and power of the oscillation. When a top junction, SAF and AFM layers are included in a PSTO stack as represented in FIGS. 2b, 3b, MOL oscillation shows irregular behavior and lower power than in the case of PSTO stack 11 only. Therefore, although the additional layers 4-8 are useful in acquiring oscillation information of the MOL 31-33, the second (top) MR junction also changes the MOL oscillation behavior. The change to irregular oscillations and lower power is especially not desirable when uniform and high power MOL oscillation is required on a continuous basis for optimum performance while characterization of oscillation frequency is only needed occasionally, for example, when the PSTO is used as a RF field generator in a magnetic recording device.

Another disadvantage of the FIG. 1 structure is that the PMA layer 32 is separated from the lower junction layer 2 by a soft magnetic layer 31. This configuration is found not to be effective for generating STO induced oscillation in MOL 31-33 in actual fabricated devices as will be explained later with regard to FIG. 5b.

U.S. Patent App. Publication 2009/0201614 discloses a hybrid spin torque oscillator having a separate oscillating field generating unit that supplies an oscillating field through magnetostatic coupling to a magnetoresistive (MR) element. When a DC current is applied to the MR element in the presence of the oscillating field, magnetic resonance occurs in the MR free layer. An AC component is formed by device resistance variation as a function of time and is extracted by a bias tee formed with a capacitor and an inductor to obtain a microwave output.

U.S. Pat. No. 7,589,600 describes the use of an electromagnet to provide an in-plane field that induces an oscillation in a STO structure.

In U.S. Pat. No. 7,009,877, a three terminal structure is employed in spin torque switching of a MRAM storage layer wherein the switched state is sensed with a MTJ.

U.S. Patent Application 2010/0110592 discloses a STO having a non-magnetic layer disposed between a first magnetic layer and a second magnetic layer. A magnetic field is applied in a direction substantially perpendicular to the principal plane and a current is passed perpendicular to the principal plane.

U.S. Pat. No. 7,652,915 describes spin torque microwave oscillation wherein the oscillation frequency is a function of the memory element size, shape, and anisotropy. The memory element is read by measuring resistance either with a DC current or by measuring the resonant frequency.

U.S. Pat. No. 7,764,538 teaches vertical current flow from an oscillator to a MTJ.

In U.S. Patent Application 2009/0310244, an electromagnetic field generating element is disclosed that comprises a spin wave excitation layer adjacent to a first magnetic pole and having its magnetization direction varied in response to external magnetic fields. A spin wave excitation current flows perpendicular to the layer planes from the first magnetic pole to a second magnetic pole.

SUMMARY OF THE INVENTION

One objective of the present invention is to provide a PSTO RF signal generator structure in which at least one layer in the STO component is capable of being excited into a magnetization oscillation state.

A second objective of the present invention is to provide a PSTO structure wherein an applied magnetic field is used in combination with a high density current to induce a STO layer into an oscillation state and the resulting oscillation frequency may be tuned by varying the field after oscillation is initiated.

Another objective of the present invention is to provide a three electrical terminal structure to isolate a high density STO current through a GMR junction from a low density RF signal generation current in an adjacent TMR junction.

According to one embodiment of the present invention, these objectives are achieved in a PSTO device wherein a STO component comprised of a MRL/first spacer/MOL stack in a GMR configuration is electrically isolated from a RF signal generation stack having a sensing layer/second spacer/reference layer/AFM configuration in a magnetoresistive (MR) sensor wherein the second spacer is a tunnel junction layer. The upper MOL layer in the STO stack and the lower sensing layer in the MR sensor stack are separated by a non-magnetic conductive layer but are magnetostatically coupled. A first terminal is connected to the non-magnetic conductive layer, a second terminal is connected to the MRL, and a third terminal is connected to the upper layer in the MR sensor.

The MRL in the STO stack has perpendicular magnetic anisotropy (PMA), and the first spacer is preferably a conductive metal such as Cu. In one embodiment, the MOL is a composite with a lower PMA magnetic layer adjoining a top surface of the first spacer, and an upper soft magnetic layer abutting a bottom surface of the non-magnetic conductive layer wherein the lower PMA layer and upper soft magnetic layer are exchange coupled. The MR sensor with a TMR junction may be comprised of a stack in which a magnetic sensing layer, tunnel junction layer, reference layer, exchange layer, pinned layer, and an anti-ferromagnetic (AFM) layer are sequentially formed on a top surface of the non-magnetic conductive layer. The soft magnetic layer in the STO and the magnetic sensing layer in the TMR element experience magnetostatic coupling when their magnetizations have an in-plane component. During an operating mode, a magnetic field is applied in a direction perpendicular to the planes of the STO and TMR junction layers. When a high density current flows from the second terminal to the first terminal, a certain portion of electrons are reflected from the MRL/first spacer interface back into the MOL layer to induce a magnetization oscillation with a significant in-plane magnetization component. The lower PMA layer oscillates together with the upper soft magnetic layer but at a smaller amplitude. As a result, the sensing layer in the TMR stack also oscillates under the magnetostatic coupling influence of the soft magnetic layer and thereby produces a varying voltage across the TMR element. MOL and the TMR sensing layer preferably have substantially the same thickness, size, and magnetic moment (Mst value) such that under the same applied field, the intrinsic oscillation frequencies of the two layers are substantially the same. A low density current is flowed between the second and third terminals in either direction to generate an AC voltage signal to determine RF frequency in the sensing layer.

In a second embodiment, the features of the first embodiment are retained except the MOL in the STO stack is a single layer that may be a soft magnetic layer or a magnetic layer having a certain PMA. Preferably, the TMR sensing layer has a magnetic property, physical size, and thickness substantially the same as that of the MOL in order to promote efficient magnetostatic coupling between the two layers and induce a magnetization oscillation in the TMR sensing layer when the MOL is excited into an oscillation state.

DETAILED DESCRIPTION OF THE INVENTION

The present invention is a PSTO device wherein a high density STO current is isolated from a low density RF generation current. The perpendicular spin torque oscillator may be employed as a RF field generator in a magnetic recording head or may serve as a reference oscillator or directional microwave transmitter in devices such as cell phones, radar systems, and computer chips. The magnetic oscillation layer (MOL) as described herein is considered a "free" ferromagnetic layer in that its magnetization orientation is free to change (oscillate) in the presence of a direct current flowing perpendicular to the plane of the MOL and under the influence of an applied magnetic field. Magnetic layers as defined herein are ferromagnetic layers.

Figure 4:
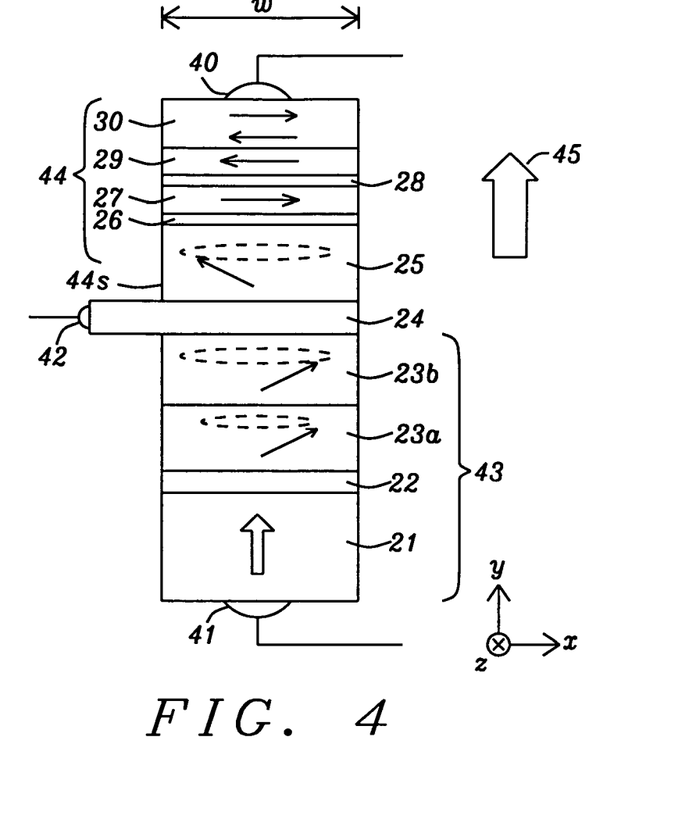
FIG. 4 is a cross-sectional view of a PSTO with a three terminal structure in which a STO current flows through a lower GMR stack and a RF signal generation current flows through an upper TMR element according to one embodiment of the present invention.

Referring to FIG. 4, a first embodiment of the present invention is depicted wherein a PSTO device is comprised of a STO component 43 and a RF generation component 44 hereafter referred to as "RF generator" or "MR sensor" that are separated by a non-magnetic conductive layer 24. In one aspect, STO 43 is a GMR junction comprised of a PMA magnetic layer 21 that serves as a magnetic reference layer (MRL), and a stack including a first junction layer also known as non-magnetic spacer 22, second PMA magnetic layer 23a, and a soft magnetic layer 23b that are sequentially formed on the MRL. It should be understood that additional layers such as a seed layer may be formed between MRL 21 and a substrate (not shown), and the MRL may be laminated in order to achieve an optimum PMA value. According to one embodiment, PMA layer 21 and second PMA layer 23a may be comprised of a $(Co/Ni)_x$ lamination where x is between about 5 and 50 as described in related Headway application Ser. No. 12/800,196. However, the present invention is not limited to $(Co/Ni)_x$ laminated layers and layers 21, 23a may be any PMA layer used in the art.

Spacer 22 may be made of a conductive material such as Cu, or may have a confining current pathway (CCP) configuration in which Cu pathways are formed in an oxide matrix such as $AlO_x$. Layers 23a, 23b are exchange coupled to each other and form a composite magnetic oscillation layer (MOL) wherein the magnetization in each layer is free to oscillate when subjected to an applied magnetic field perpendicular to the planes of the layers, either in the (+) or (−) y-axis direction, and when an electric current of sufficiently high density flows in a direction perpendicular to the planes of the layers from a first electrical terminal 42 to a second electrical terminal 41. The high current density is in the range of $1 \times 10^7$ to $1 \times 10^9$ Amps/cm² in order to exceed the critical current density for causing a spin torque effect on the MOL. It is believed that reflected electrons from the MRL/spacer interface excite the MOL layer and thereby induce an oscillation state in layers 23a, 23b with significant in-plane amplitude. Note that PMA layer 23a oscillates with soft magnetic layer 23b but at smaller amplitude. In other words, PMA layer 23a has the same oscillation frequency as soft magnetic layer 23b but a smaller in-plane magnetization component. Soft magnetic layer 23b may be made of CoFe, a CoFe alloy, or a composite thereof, for example.

Non-magnetic conductive layer 24 is preferably a metal made of Cu or the like or a metal alloy having a bottom surface that contacts an uppermost layer of STO 43, and with a top surface that adjoins a bottom layer in RF generator 44. Preferably, conductive layer 24 has a width in an in-plane direction along the x-axis that is greater than the width w of the layers in STO 43 and RF generator 44 in order to allow an electrical connection to a first electrical terminal hereafter referred to as first terminal 42. For example, first terminal 42 may include a via (FIG. 7) formed in a dielectric layer and between a top surface of conductive layer 24 and an overlying metal line (not shown). In this case, the via should be separated from the nearest point on sidewall 44s by a sufficient distance such that a current flowing in the via does not produce an undesired magnetic field on RF generator 44 and especially on sensing layer 25. Although the width w of RF generator 44 is essentially the same as that of STO 43 in the exemplary embodiment, the present invention also anticipates that the RF generator may have a width greater or less than the width of STO 43. The thickness of conductive layer 24 is preferably less than or equal to that of sensing layer 25 or the combined thickness of layers 23a, 23b to minimize the distance between soft magnetic layer 23b and the sensing layer and thereby strengthen magnetostatic coupling between layers 23b, 25.

According to one embodiment, RF generator 44 is a magnetoresistive (MR) sensor with a TMR configuration also known as a magnetic tunnel junction (MTJ) wherein a magnetic sensing layer (sensing layer) 25, a second junction layer hereafter referred to as tunnel junction layer 26, reference layer 27 having an in-plane pinned magnetization, exchange coupling layer 28, pinned layer 29, and AFM layer 30 are sequentially formed on a top surface of conductive layer 24. A key feature is that sensing layer 25 should have a Mst value within about ±50% of the Mst value for MOL layer (23a, 23b) where Mst is the product of saturation magnetization (Ms) and film thickness (t). Thus, the magnetic moment, thickness, and in-plane area size of sensing layer 25 should be substantially the same as that of the area, combined thickness, and combined magnetic moment for layers 23a, 23b. Moreover, sensing layer 25 may be a single layer or a composite and is magnetostatically coupled to soft magnetic layer 23b such that when an oscillating state is established in the MOL, an oscillation state is induced in the sensing layer with substantially the same frequency as in layers 23a, 23b when the aforementioned Mst relationship is maintained. Preferably, in an embodiment wherein MR sensor 44 and STO 43 have essentially the same width w, the MR sensor is aligned vertically above the STO such that sidewalls 43s, 44s are substantially coplanar in order to provide an efficient magnetostatic coupling between soft magnetic layer 23b and sensing layer 25. In a less preferred embodiment, a capping layer (not shown) may be formed between soft magnetic layer 23b and conductive layer 24 but this configuration will increase the distance between soft magnetic layer 23b and sensing layer 25 and result in less efficient coupling.

Tunnel junction layer 26 may be comprised of a metal oxide such as AlOx, MgO, TiOx, or the like, or an oxide of a metal alloy. Reference layer 27 is a ferromagnetic layer that is magnetically coupled to pinned ferromagnetic layer 29 through a coupling layer 28 that is made of Ru, for example, to form a synthetic anti-ferromagnetic (SyAF) configuration that is pinned by AFM layer 30. Therefore, reference layer 27 has a magnetization that is effectively pinned in an in-plane direction by the AFM layer 30.

An important feature of the PSTO of the first embodiment is a three electrical terminal configuration so that a high density current required to induce an oscillation state in STO 43 is isolated from RF generator 44 thereby preventing a breakdown in the MR sensor, and particularly in the tunnel junction layer 26. Therefore, a first electrical pathway is established between first terminal 42 and second terminal 41 to carry high density STO current, and a second electrical pathway is formed between first terminal 42 and third terminal 43 to carry a RF generation current with a low density that is less than about $1 \times 10^7$ Amps/cm$^2$. Second terminal 41 may be a bottom lead and third terminal 43 may be considered a top lead such as a capping layer or a conductive line.

During an operating mode, an external magnetic field 45 is applied to the entire PSTO structure including STO 43 and RF generator 44. In the exemplary embodiment, field 45 is applied along the (+) y-axis to align the perpendicular magnetization components of MRL 21, MOL layers 23a, 23b, and sensing layer 25 in the same direction as the field direction. Preferably, MRL 21 has an entirely perpendicular to plane magnetization orientation while layers 23a, 23b, 25 magnetizations are tilted partially out of the film plane. When a high density current flows from first terminal 42 to second terminal 41, electrons pass through MOL layers 23a, 23b to MRL 21 but it is believed that electrons reflected from the MRL/spacer 22 interface are responsible for exciting the MOL magnetization from a quiescent state into a significant in-plane oscillation. In an alternative embodiment, where the external magnetic field 45 is applied in a (−) y-axis direction, the resulting oscillation state in MOL layers 23a, 23b and in sensing layer 25 will have an in-plane component, and a perpendicular component pointing in the same direction as the applied field.

Figure 5A:
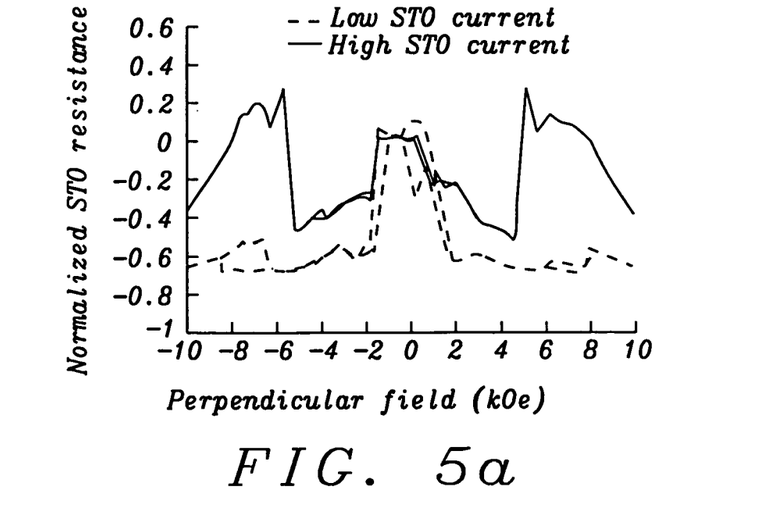
FIG. 5a is a plot showing experiment results for STO resistance vs. field at low and high current densities for a field tunable STO structure according to an embodiment of the present invention.

In general, the applied field is preferably greater than about 1000 Oe, but as indicated in the example relating to FIG. 5a, the optimum operating range may be from 5000 Oe to 8000 Oe depending on the Mst value of the MOL layers 23a, 23b. The PMA character of MRL 21 is relied upon to achieve a higher frequency oscillation of the MOL at a relatively low applied magnetic field. There is also a maximum effective field magnitude related to the aforementioned Mst value. For instance, in FIG. 5a, as the field increases from 5000 Oe to 10000 Oe, resistance in the STO junction decreases and oscillation frequency increases. Thus, STO frequency may be "tuned" by changing the applied field within limits determined by the Mst value of layers 23a, 23b, 25 and in part by the PMA magnitude of MRL 21. In FIG. 5a, the oscillation state of MOL 23a, 23b is no longer maintained above approximately 8000 Oe as described in more detail in a later section. Magnetic field 45 may be applied by an electromagnet (not shown) or by another means used by one skilled in the art.

During the operating mode, the oscillating in-plane magnetization component in MOL layers 23a, 23b produces an alternating magnetic field in sensing layer 25. When the Mst value of MOL (23a, 23b) is within a certain % of the Mst value for sensing layer 25 as discussed previously, then the intrinsic oscillation frequencies of the MOL and the sensing layer are substantially the same. However, the in-plane magnetization oscillation of sensing layer 25 has a 180 degree phase difference compared with that of MOL layers 23a, 23b. In effect, MOL and sensing layer 25 are in a pseudo anti-ferromagnetic coupled FMR mode. Therefore, with sensing layer 25 being part of MR sensor 44 and a DC current flowing between first terminal 42 and third terminal 43 in either direction, an AC voltage signal can be generated between the first and third terminals from a resistance change in the MR sensor due to magnetostatic coupling between the sensing layer 25 and the oscillating MOL 23a, 23b. Furthermore, the RF frequency of the AC voltage signal may be changed by varying the field 45 amplitude because of the AFM coupling between MOL layers 23a, 23b and sensing layer 25.

Figure 5B:
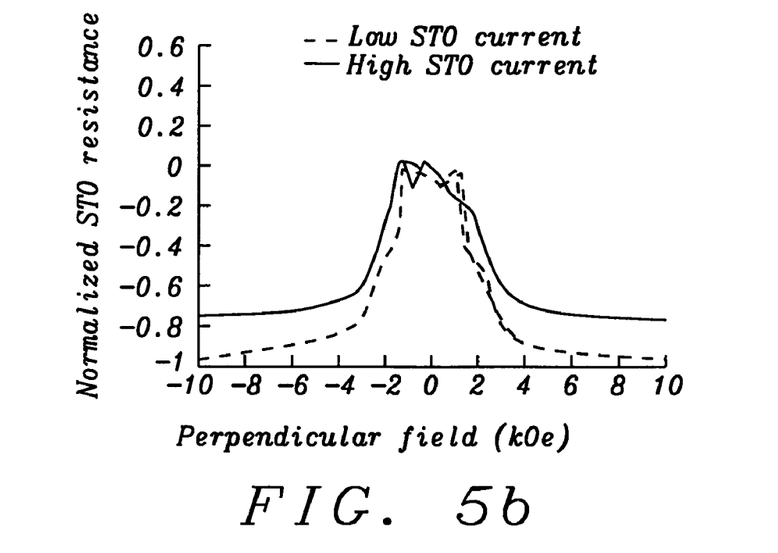
FIG. 5b is a plot showing experiment results for STO resistance vs. field at low and high current densities for a PSTO structure formed according to a prior art reference.

Referring to FIG. 5a, experimental results are shown for a STO structure representative of the first embodiment depicted in FIG. 4 wherein the MRL 21, and PMA layer 23a are made of a Co/Ni laminated structure, and the soft magnetic layer 23 and sensing layer 25 are made of CoFe. In FIG. 5b, results are shown for a STO similar to structure 11 in the prior art FIG. 1. Like the STO structure built for FIG. 5b measurements, the structure representing STO 11 has a CoFe composition for soft magnetic layers and a laminated Co/Ni structure for PMA layers. In both plots, the x-axis values are the field applied perpendicular to the film plane and the y-axis is the resistance measured from the STO elements that is offset by the STO resistance at zero field, and normalized to the full range resistance change of the STO. During the test, electrical leads are connected to the MOL and MRL (PMA) layers and a current flows through the STO stack with electrons traveling from MOL to the MRL in both cases. In both examples, STO stack size, the MRL, the MOL soft magnetic layer, and the PMA layer in the MOL all have similar properties. The major difference is the PMA layer in the MOL is sandwiched between two soft magnetic layers in the prior art structure corresponding to the results in FIG. 5b while the MOL PMA layer adjoins a Cu spacer in a structure according to a first embodiment of the present invention represented in FIG. 4 and corresponding to results in FIG. 5a. In each plot, the dashed line is the STO resistance vs. field measured at low current density and the solid line is STO resistance vs. field at high current density.

When comparing the data in FIG. 5a with FIG. 5b, note that at both low and high current densities with an applied field of 6000 Oe and 5000 Oe, respectively, STO resistance rises to a higher level in the FIG. 5a plot. With regard to FIG. 5a, it should be understood that the magnetization state changes as current magnitude increases. For example, at 0 Oe and high current density, MOL magnetization is mostly in-plane and the relative angle between MOL and PMA layer (MRL) 21 magnetization is approximately 90 degrees. As the applied vertical field increases, MOL magnetization gradually rotates out of plane and the relative angle between MOL and MRL becomes smaller to produce a lower STO resistance until about 5000 Oe where the MOL reaches an optimal oscillation condition. The optimum oscillation condition is determined by the applied field, current density, MOL layer thickness and moment, and is the point where oscillation begins with a large in-plane component thereby generating an effective angle increase between MOL and MRL magnetization which causes the observed resistance jump at about 5000 Oe. Note that the abrupt resistance rise depicted at around 5000 Oe is a first order indicator of MOL oscillation initiation and strength. As the field increases from 5000 Oe to about 8000 Oe, MOL experiences a higher vertical field and its in-plane component reduces during oscillation and results in a reduction in STO resistance. Between 8000 and 10000 Oe, STO resistance returns to the original level observed at the 0 Oe condition and the oscillation state is terminated.

On the other hand, there is no resistance jump that appears in FIG. 5b for either the high or low current density case. Therefore, the data indicates the MOL is never excited into an oscillation mode. In fact, when current direction is reversed to allow electrons to flow from MRL to MOL as described in the prior art, the MOL excitation feature is still not found even at high current densities. Therefore, we conclude that a vertical field is required for exciting the MOL into an oscillation mode in a perpendicular STO structure even when the MOL includes a PMA layer. Moreover, the PMA portion of the MOL should adjoin the spacer layer to take full advantage of reflected electrons from the MRL/spacer interface that are necessary to excite the MOL into an oscillation mode. In other words, the prior art STO pictured in FIG. 1 is not practical for establishing an MOL oscillation state while the STO structure according to the first embodiment of the present invention in FIG. 3 is a viable candidate.

Figure 6:
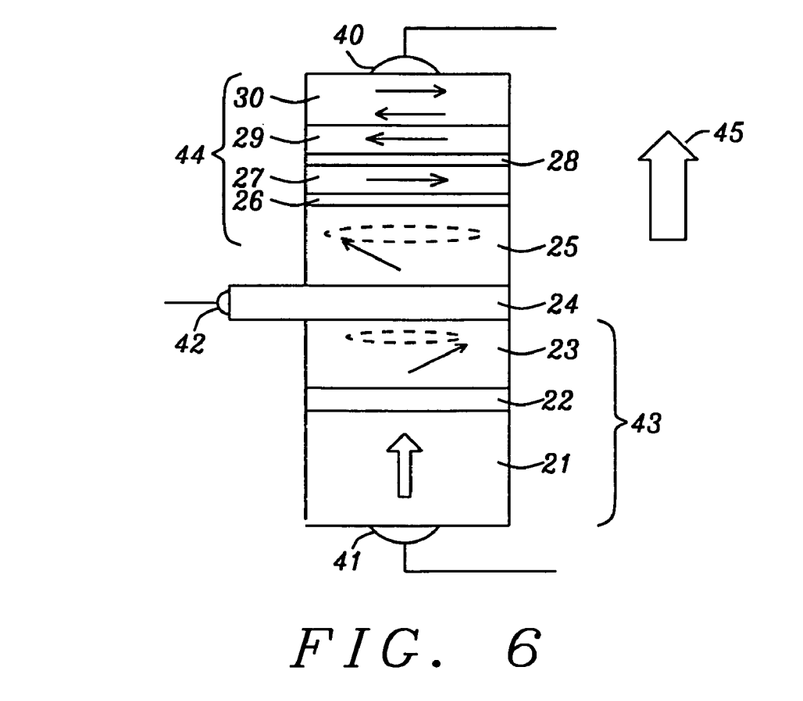
FIG. 6 is a cross-sectional view of a PSTO with a three terminal structure in which a STO current flows through a lower GMR stack and a RF signal generation current flows through an upper TMR element according to a second embodiment of the present invention.

Referring to FIG. 6, a second embodiment of the present invention is depicted and retains all the features of the first embodiment except the composite MOL 23a/23b in FIG. 4 is replaced by a single MOL 23 that may be a soft magnetic layer or a magnetic layer with PMA. Preferably, sensing layer 25 has a Mst value within about ±50% of the Mst value for MOL 23.

During an operating mode, an external magnetic field 45 is applied to the entire PSTO structure including STO 43 and RF generator 44 in either a (+) or (−) y-axis direction to align the perpendicular magnetization components of MRL 21, MOL 23, and sensing layer 25 in the same direction as the field direction. Preferably, MRL 21 has an entirely perpendicular to plane magnetization orientation while MOL 23 and sensing layer 25 magnetizations are tilted partially out of the film plane. When a high density current flows from first terminal 42 to second terminal 41, electrons pass through MOL layer 23 to MRL 21. A portion of the electrons are reflected from the MRL/spacer 22 interface back into the MOL to excite the MOL magnetization from a quiescent state into a significant in-plane oscillation. Subsequently, the oscillating in-plane magnetization component in MOL 23 produces an oscillating magnetic field in sensing layer 25. When the Mst value of MOL 23 is within a certain % of the Mst value for sensing layer 25 as discussed previously, then the intrinsic oscillation frequencies of MOL and the sensing layer are substantially the same. However, the in-plane magnetization oscillation of sensing layer 25 has a 180 degree phase difference compared with that of MOL 23 which means the MOL and sensing layer 25 are in a pseudo anti-ferromagnetic coupled FMR mode. Therefore, with sensing layer 25 being part of MR sensor 44 and a DC current flowing between first terminal 42 and third terminal 43 in either direction, an AC voltage signal can be generated between the first and third terminals from a resistance change in the MR sensor due to magnetostatic coupling between the sensing layer and the oscillating MOL 23.

Figure 7:
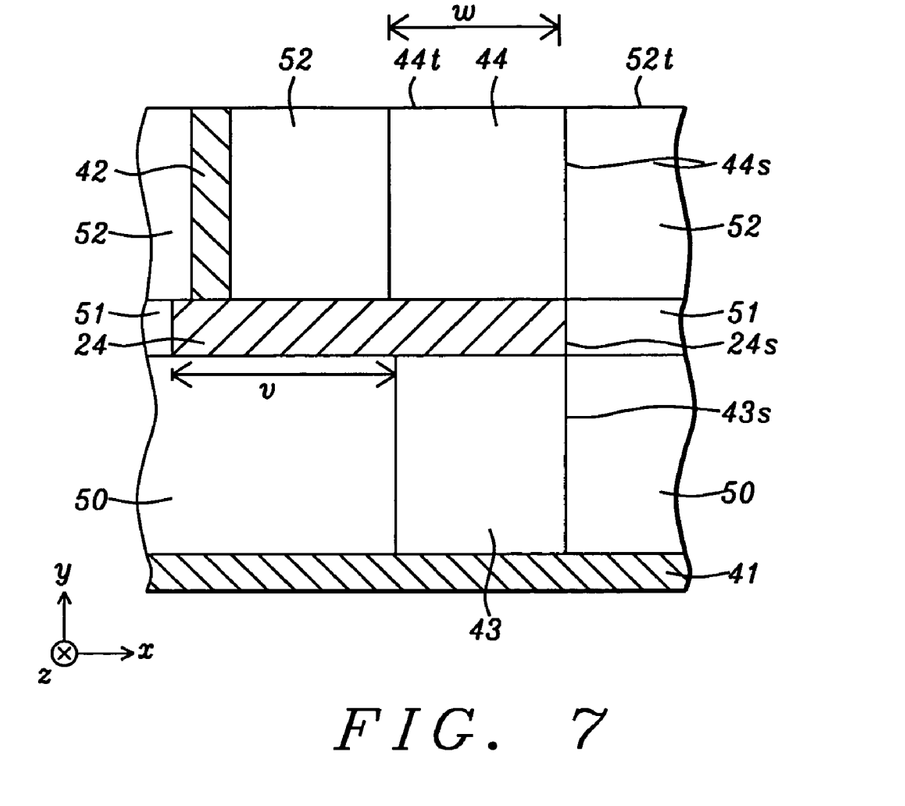
FIG. 7 is a cross-sectional view of an embodiment of the present invention that includes dielectric layers surrounding the STO and MR sensor stacks.

Referring to FIG. 7, a cross-sectional view is shown of an embodiment of the present invention wherein dielectric layers 50, 52 are included adjacent to STO 43 and MR sensor 44, respectively, and the second terminal 41 is a conductive layer. It should be understood that second terminal 41 may be formed coplanar with a dielectric layer (not shown) which electrically isolates the second terminal from other adjacent conductive lines (not shown). According to another aspect, the first terminal is comprised of a via 42 having a top surface that is connected to an overlying metal line (not shown), and a bottom surface which contacts conductive layer 24. Note that all layers above the top surface 44t of the MR sensor have been removed to focus attention on the PSTO device including the field tunable STO and RF generator described in the first and second embodiments.

Those skilled in the art will appreciate that according to one embodiment, the PSTO structure in FIG. 7 may be fabricated by following a conventional method to initially form a STO 43 on second terminal 41. A fabrication sequence typically involves depositing the entire STO stack of layers by a sputter deposition system on second terminal 41, forming a photoresist masking layer on the top STO layer in which the desired shape and size of the STO is patterned by a lithography process, and transferring the photoresist mask shape through the STO stack by one or more etching steps. Once the STO is patterned and sidewall 43s formed, the photoresist layer is removed and a first dielectric layer 50 may be deposited by a chemical vapor deposition (CVD) or a plasma enhanced CVD process, for example. Thereafter, a chemical mechanical polish (CMP) process may be employed to form a top surface of STO 43 that is coplanar with a top surface of first dielectric layer 50.

Figure 8:
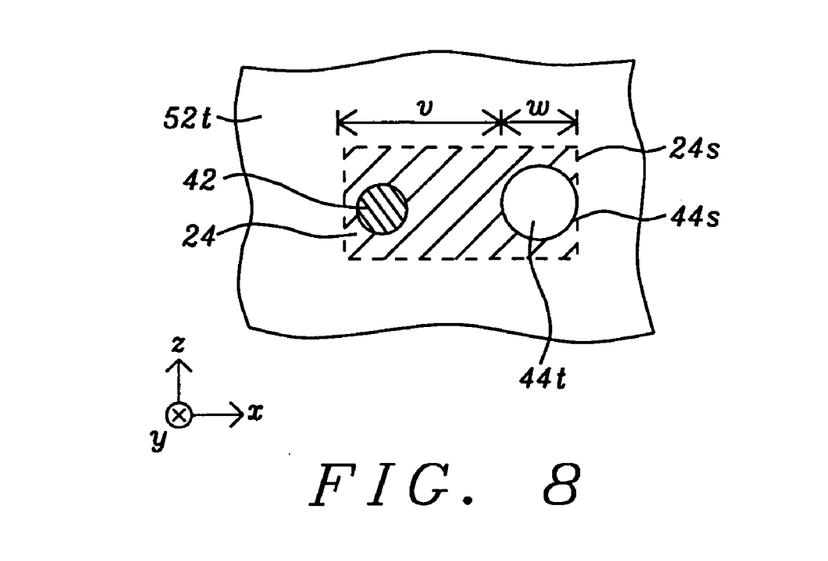
FIG. 8 is a top-down view of the embodiment in FIG. 7 that shows the overlay of the RF generator (MR sensor) on the non-magnetic conductive spacer which separates the STO and MR sensor components.

Subsequently, a conductive layer 24 is formed within a second dielectric layer 51 by a well known sequence such as a single damascene process followed by planarization with a CMP process. In the exemplary embodiment (FIG. 8), conductive layer 24 has a rectangular shape from a top-down view with one side 24s aligned with a sidewall 44s of the MR element that has a top surface 44t. However, the present invention also encompasses other embodiments wherein the conductive layer has a shape other than a rectangle and/or may extend beyond the sidewall 44s in all directions. Preferably, conductive layer 24 covers the entire top surface of STO 43 (not shown) which is directly below top surface 44t in the (−) y-axis direction or behind the plane of the paper. It is important to achieve good overlay of MR sensor 44 above STO 43 so that strong magnetostatic coupling is realized between the magnetic oscillation layer (23, or 23a+23b) with sensing layer 25 as described previously. Overlay is optimized with the use of alignment marks during the aforementioned lithography process as appreciated by those skilled in the art. Although the exemplary embodiment shows a circular shape for top surface 44t, the shape of the top surface of MR sensor 44 (and STO 43) is not necessarily circular and may be an ellipse or other shape used in the art.

Returning to FIG. 7, conductive layer 24 extends a certain distance v in an in-plane (x-axis) direction from the nearest side of MR sensor 44. In a following sequence of steps, a fabrication scheme similar to that employed for forming STO 43 may be used to deposit the layers in the MR sensor 44 on the conductive layer and adjoining dielectric layer 51, and then pattern the MR sensor stack to yield sidewall 44s. In an embodiment wherein the sidewalls 43s, 44s are essentially vertical and the STO and MR sensor have essentially the same width w, sidewall 43s is preferably formed along the same vertical plane as sidewall 44s. In an alternative embodiment wherein the top surface of STO 43 has a larger or smaller area size in the (x, z) plane than the bottom surface of MR sensor 44, sidewall 43s may not align vertically with sidewall 44s. After sidewall 44s is formed, a third dielectric layer 52 is deposited and then a CMP process may be performed to form a top surface 52t that is coplanar with top surface 44t. Subsequently, via 42 may be formed within dielectric layer 52 by a damascene process, for example. According to one embodiment, a third electrical terminal 40 may be formed on top surface 44t and within a fourth dielectric layer (not shown) in a scheme similar to that employed for fabricating conductive layer 24 on STO 43 and dielectric layer 50.

The embodiments of the present invention provide an advantage over the prior art in that a viable STO structure has been disclosed and demonstrated to be operable when an applied perpendicular field and a high density current are employed to excite an oscillation state in a MOL. Furthermore, oscillation frequency may be tuned in the MOL and in a magnetostatically coupled sensing layer within an adjacent MR sensor component by adjusting the magnitude of the applied field within a certain range. Device stability is maintained by implementing a three electrical terminal configuration to allow a high density current to flow only through the STO component while a low density current passes through a RF generator (TMR junction) component. Therefore, the unworkable dilemma of a two terminal design is avoided wherein a high density current is required to excite a magnetic oscillation layer but undesirably destroys the MR sensor junction needed to read the RF frequency of the oscillation. Another important advantage of the present invention over the prior art is that the MR sensor junction of the first and second embodiments described herein does not disrupt or have a parasitic effect on the STO oscillation because the MR sensor junction does not share any layers with the STO (GMR junction). Furthermore, the STO GMR junction and TMR junction in the MR sensor may be independently fabricated which enables each junction to be optimized separately without comprising the performance of the other junction.

While this invention has been particularly shown and described with reference to, the preferred embodiment thereof, it will be understood by those skilled in the art that various changes in form and details may be made without departing from the spirit and scope of this invention.

We claim:
1. An RF signal generation device, comprising:
(a) a spin torque oscillator (STO) with a top surface and having at least one magnetic reference layer (MRL), a magnetic oscillation layer (MOL), and a first junction layer formed between the MRL and MOL;
(b) a magnetoresistive (MR) sensor having at least one magnetic sensing layer that is magnetostatically coupled with said MOL, a second magnetic reference layer with an in-plane pinned magnetization, and a second junction layer formed between the magnetic sensing layer and the second magnetic reference layer; and
(c) a non-magnetic conductive spacer layer that is sandwiched between said MOL layer and said magnetic sensing layer wherein an oscillation state having an oscillation frequency is induced in said MOL when a magnetic field is applied to said STO and MR sensor in a direction perpendicular to the STO top surface concurrently with a first electric current flowing from said conductive spacer layer through the MOL to the MRL, and said magnetostatic coupling generates magnetic oscillation with an RF frequency in said magnetic sensing layer that produces a varying voltage across the MR sensor when a second electric current flows through the MR sensor layers.

2. The RF signal generation device of claim 1 wherein the first junction layer is a Cu layer.

3. The RF signal generation device of claim 1 wherein the second junction layer is a tunnel junction layer comprised of a metal oxide or an oxide of a metal alloy.

4. The RF signal generation device of claim 1 wherein said magnetic oscillation layer is a soft magnetic layer, or is a magnetic layer with perpendicular magnetic anisotropy (PMA).

5. The RF signal generation device of claim 1 wherein said magnetic oscillation layer is a composite including a magnetic layer with PMA and a soft magnetic layer.

6. The RF signal generation device of claim 5 wherein said PMA layer contacts a top surface of the first junction layer and the soft magnetic layer contacts a bottom surface of the non-magnetic conductive spacer.

7. The RF signal generation device of claim 1 wherein the applied magnetic field has a magnitude greater than about 1000 Oe.

8. The RF signal generation device of claim 1 wherein the second reference layer is pinned by a synthetic anti-ferromagnetic (SyAF) configuration comprised of a pinned magnetic layer and a Ru coupling layer formed between the second reference layer and pinned magnetic layer, said pinned magnetic layer is pinned through contact with an anti-ferromagnetic (AFM) layer.

9. The RF signal generation device of claim 1 wherein the sensing layer has a thickness, in-plane area, and magnetic moment substantially the same as that of the magnetic oscillation layer such that the Mst value of the sensing layer is within about ±50% of Mst value of the magnetic oscillation layer.

10. The RF signal generation device of claim 7 wherein the oscillation frequency of said magnetic oscillation layer can be changed by varying the magnitude of the applied magnetic field.

11. The RF signal generation device of claim 7 wherein the RF frequency in said magnetic sensing layer can be changed by varying the magnitude of the applied magnetic field.

12. An RF signal generation structure, comprising:
(a) a spin torque oscillator (STO) with a top surface, bottom surface, and sidewall, and having at least one magnetic reference layer (MRL), a magnetic oscillation layer (MOL), and a first junction layer formed between the MRL and MOL;

(b) a magnetoresistive (MR) sensor having a top surface, bottom surface, and sidewall, and at least one magnetic sensing layer that is magnetostatically coupled with said MOL, a second magnetic reference layer with an in-plane pinned magnetization, and a second junction layer formed between the magnetic sensing layer and the second reference layer;

(c) a non-magnetic conductive spacer layer that contacts the STO top surface and the MR sensor bottom surface, and extends a certain distance from the STO and MR sensor sidewalls along an in-plane axis; and (d) a three electrical terminal configuration, comprising:
 (1) a first electrical terminal connected to a portion of the non-magnetic spacer that extends along the in-plane axis;
 (2) a second electrical terminal connected to the STO bottom surface; and
 (3) a third electrical terminal connected to the MR sensor top surface;

wherein an oscillation state having an oscillation frequency is induced in said MOL when a magnetic field is applied to said STO and MR sensor in a direction perpendicular to the STO top surface concurrently with a first electric current flowing from said first terminal to said second terminal, and said magnetostatic coupling generates magnetic oscillation with an RF frequency in said magnetic sensing layer that produces a varying voltage across the MR sensor when a second electric current flows between the second and third electrical terminals.

13. The RF signal generation structure of claim 12 wherein the first electrical current has a high current density between about $1 \times 10^7$ Amps/cm$^2$ and $1 \times 10^9$ Amps/cm$^2$.

14. The RF signal generation structure of claim 12 wherein the second electrical current has a low current density of less than about $1 \times 10^7$ Amps/cm$^2$.

15. The RF signal generation structure of claim 12 wherein the STO has a first junction layer comprised of Cu and the MR sensor has a second junction layer that is a tunnel junction comprising an oxide.

16. The RF signal generation structure of claim 12 wherein the magnetic oscillation layer is comprised of a soft magnetic layer or a magnetic layer with PMA.

17. The RF signal generation device of claim 12 wherein said magnetic oscillation layer is a composite including a lower magnetic layer with PMA that contacts the first junction layer, and an upper soft magnetic layer.

18. The RF signal generation device of claim 12 wherein the applied magnetic field has a magnitude greater than about 1000 Oe.

19. The RF signal generation device of claim 12 wherein the magnetic sensing layer has a thickness, in-plane area, and magnetic moment substantially the same as that of the magnetic oscillation layer such that a Mst (saturation magnetization×thickness) value of the sensing layer is within about ±50% of the Mst value of the magnetic oscillation layer.

20. The RF signal generation device of claim 18 wherein the oscillation frequency of said magnetic oscillation layer can be changed by varying the magnitude of the applied magnetic field.

21. The RF signal generation device of claim 18 wherein the RF frequency in said magnetic sensing layer can be changed by varying the magnitude of the applied magnetic field.

* * * * *